United States Patent [19]
Steinweg et al.

[11] Patent Number: 5,596,505
[45] Date of Patent: Jan. 21, 1997

[54] ESTIMATION OF PIN-TO-PIN TIMING FOR COMPILED BLOCKS

[75] Inventors: Russell L. Steinweg, Santa Clara; Michael A. Zampaglione; Pei H. Lin, both of San Jose, all of Calif.

[73] Assignee: VLSI Technology, Inc., San Jose, Calif.

[21] Appl. No.: 96,130

[22] Filed: Jul. 23, 1993

[51] Int. Cl.⁶ ........................................... G06F 17/50
[52] U.S. Cl. ............................... 364/490; 364/489
[58] Field of Search ............................ 364/489, 490, 364/491, 488, 578, 900

[56] References Cited

U.S. PATENT DOCUMENTS

| | | | |
|---|---|---|---|
| 4,263,651 | 4/1981 | Donath et al. | 364/489 |
| 4,656,580 | 4/1987 | Hitchcock, Sr. et al. | 364/200 |
| 4,698,760 | 10/1987 | Lembach et al. | 364/490 |
| 4,823,278 | 4/1989 | Kikuchi et al. | 364/491 |
| 4,827,428 | 5/1989 | Dunlop et al. | 364/491 |
| 4,924,430 | 5/1990 | Zasio et al. | 364/578 |
| 5,218,551 | 6/1993 | Agrawal et al. | 364/489 |
| 5,237,514 | 8/1993 | Curtin | 364/490 |
| 5,305,229 | 4/1994 | Dhan | 364/489 |
| 5,309,370 | 5/1994 | Wong | 364/490 |
| 5,365,463 | 11/1994 | Donath et al. | 364/578 |
| 5,426,591 | 6/1995 | Ginetti et al. | 364/489 |

OTHER PUBLICATIONS

"A User–Configurable RAM Compiler For Gate Arrays", Russell L. Steinweg et al, VLSI Technology, Inc., San Jose, CA, pp. 1–4, believed to have been disclosed at a conference held Sep. 25–28, 1989.

"A Flexible Gate Array RAM Compiler With Full Design Tool Integration", Russell L. Steinweg et al, VLSI Technology, Inc., San Jose, CA, pp. 1–6, believed to have been presented at EURO–ASIC conference in May, 1990.

"A Gate Array RAM Compiler with Full User Control", Russell L. Steinweg et al, VLSI Technology, Inc., San Jose, CA, pp. 1–12, believed to be an unpublished VLSI draft document.

*Primary Examiner*—Kevin J. Teska
*Assistant Examiner*—Thai Phan
*Attorney, Agent, or Firm*—Burns, Doane, Swecker & Mathis LLP

[57] ABSTRACT

A method for producing an electrical circuit by determining the input-to-output timing of compiled circuit blocks includes steps of determining a signal delay of a component due to physical characteristics of the component. The physical characteristics include at least a capacitance based upon relative placement of the component during compilation of a circuit block. The method further includes steps of determining an input-to-output speed for a circuit block by combining delays due to physical characteristics through alternate paths of the circuit block, and producing a compiled circuit block having a plurality of components by placing the components in the circuit block based on the steps of determining.

20 Claims, 2 Drawing Sheets

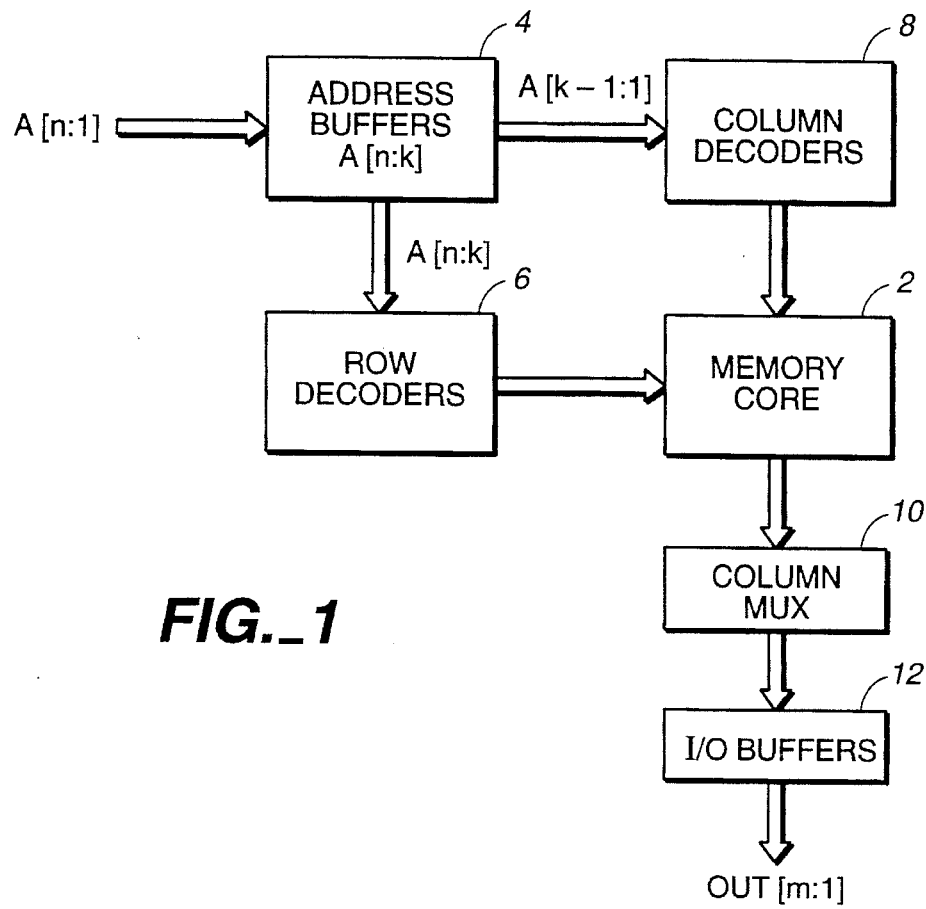
FIG._1
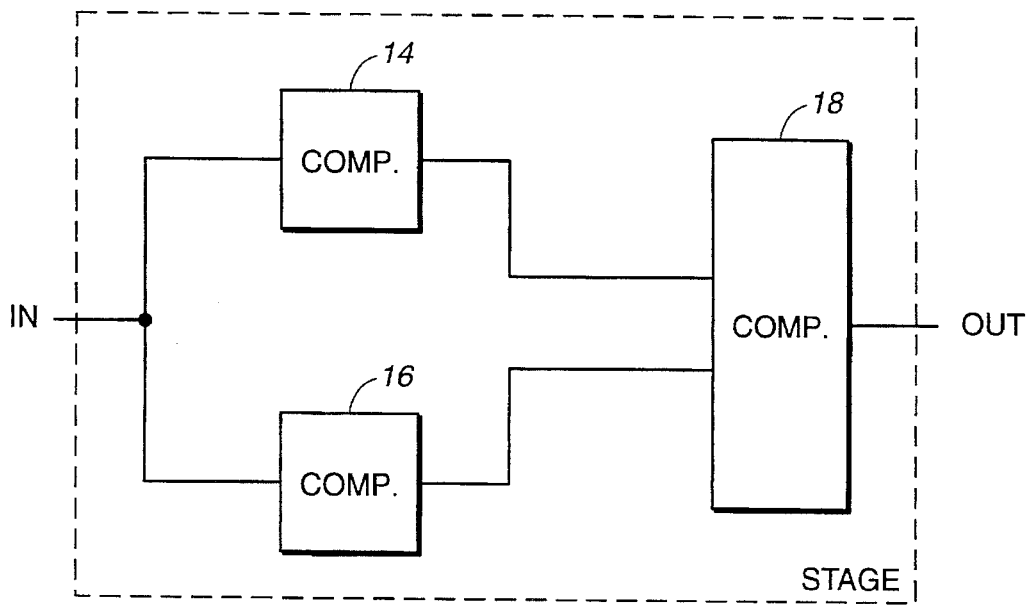
FIG._2

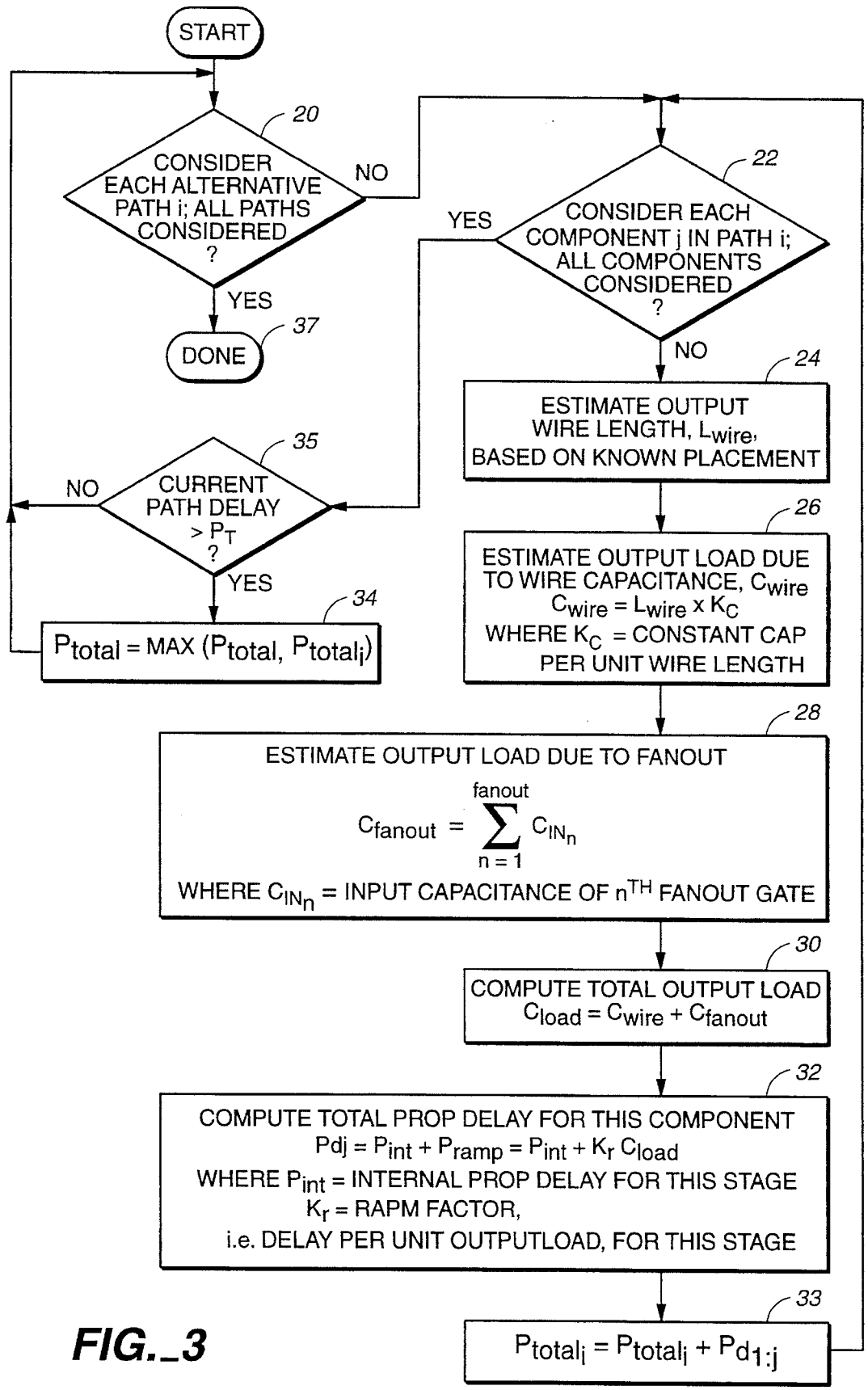
FIG._3

ESTIMATION OF PIN-TO-PIN TIMING FOR COMPILED BLOCKS

BACKGROUND OF THE INVENTION

1. Field of the Invention

The present invention generally relates to the production of electrical circuits, such as integrated circuits, using block compiler systems and, more particularly, block compiler systems that quickly and accurately estimate the speed of critical paths through a compiled circuit block.

2. Related Art

It is well-known to use computerized block compiler systems for synthesizing compiled circuit blocks as part of electrical circuits, such as application-specific integrated circuits (ASICs). To generate a simulation timing model for a compiled circuit block, a typical block compiler system connects models of physical tiles which constitute basic primitive components of the block structure.

A block compiler system that provides particular flexibility in creating a compiled circuit block is described in co-pending U.S. patent application Ser. No. 07/626,078, filed Dec. 10, 1990, the entire disclosure of which is incorporated herein by reference. The block compiler system described in that application has the advantage that it allows users to specify the logical size of an ASIC memory. Further, the block compiler system selects an optimum structure for the specified memory size according to higher-level predetermined criteria such as, for instance, minimum physical area (i.e., total number of gate sites covered by the memory), most square physical aspect ratio, and minimum access time of the overall compiled memory.

In operation, the block compiler system described in application Ser. No. 07/626,078 iteratively considers each possible memory structure for the specified memory size. The block compiler system performs the iterations by, for example, sequentially varying the partitioning of address lines between column address lines and row address lines. (This can be done by incrementing the number of column address lines from zero to the total number of address lines necessary for the specified size.)

In addition to the functional capabilities of block compiler systems described in application Ser. No. 07/626,078, however, it is important for block compiler systems to provide the capability of quickly and accurately predicting the speed of compiled circuit blocks. In practice, the speed of a compiled circuit block usually is measured by pin-to-pin timing from a block input to a block output. Conventionally, compiled circuit block speed is determined by lengthy circuit simulations performed in advance using physical blocks that have actually been built, by interpolation from tables based on specific configurations, by mathematical modelling (including behavioral modelling) of compiled circuit blocks or a combination of these. These procedures are either time-consuming or inaccurate and often entail lengthy re-simulations or re-calculations when the design of a compiled circuit block is changed.

SUMMARY OF THE INVENTION

The present invention, generally speaking, relates to highly efficient methods for designing and producing electrical circuits by estimating the input-to-output speed of unbuilt circuit blocks. More particularly, the present invention provides methods for accurately estimating pin-to-pin speed for compiled circuit blocks by combining delays associated with lower level components and delays due to interconnect (i.e., wiring) capacitance. The delays due to interconnect capacitance are based upon a predetermined relative component placement sequence to be used during compilation of a block to produce an electrical circuit.

As referenced herein, critical pin-to-pin speed represents the longest propagation time (i.e., critical delay) required for a signal to propagate from a block input to a block output along any alternate path through the circuit block. In assessing the critical path (i.e., the path associated with the critical delay), primitive models for each component located along alternate paths through the circuit block are considered.

In an exemplary embodiment of the present invention, a block compiler system determines path delays using physical characteristics of components to be included in a circuit block, such as predetermined internal delays within a component itself (determined, for example, by circuit simulation). A primitive model of each component is accessed to obtain the internal delay information. This internal delay information corresponds to an internal signal propagation ramp delay through the component.

Further, propagation ramp delay due to the total output load of a component is determined. The total output load for each component is determined using an estimated output load due to output wire capacitance and the output load due to the input capacitances of components that are connected to the output wire. These calculations are based on a predetermined placement sequence built into and used by the block compiler system when compiling the block under consideration. After determining the propagation ramp delay due to the output load for a given component, a total propagation ramp delay is determined for that component by summing the propagation ramp delay due to the output load with the internal propagation ramp delay of the component.

Preferably, the determination of path delays includes determining input-to-output speed (i.e., block input to block output) by determining timing delays along each alternate signal path through the block. This involves combining (e.g., summing) the total propagation ramp delays for the components located within each alternate path. The critical path then corresponds to the path having the greatest total propagation ramp delay (i.e., the critical pin-to-pin speed). In practice, all possible paths need not be exhaustively considered. Rather, only a subset of the possible paths need be considered, based on predetermined assumptions about the architecture. For example, in the case of a RAM with address inputs on the left, it may be known, depending on architecture, that the critical path will encompass the rightmost column of the core.

The critical pin-to-pin speed can be determined for different circuit block configurations. This information is based on physical characteristics of the circuit block and can be used to produce a compiled circuit block which conforms to predetermined constraints (e.g., timing constraints for a given circuit).

BRIEF DESCRIPTION OF THE DRAWINGS

The present invention can be further understood by reference to the following description of preferred embodiments and the appended drawings wherein:

FIG. 1 shows an exemplary illustration of a compiled circuit block for a memory structure (e.g., RAM);

FIG. 2 shows an exemplary multi-component stage of a compiled circuit block such as that of FIG. 1; and FIG. 3 is an exemplary flow chart to determine timing of a compiled block according to the present invention.

DETAILED DESCRIPTION OF THE PREFERRED EMBODIMENTS

FIG. 1 shows an exemplary illustration of a compiled circuit block for a RAM memory which includes a typical memory core 2. The memory core 2 includes a matrix of memory cells arranged in rows and columns. To address a word in memory during a read or write operation, a given row and column are enabled. Data can be written into or read from a word location at an intersection of the enabled row and column.

To enable a given bit location, an address "A" having n bits is input to the FIG. 1 circuit block via an n bit address buffer 4. Some of the address bits are directed to both row decoders 6 while the remaining bits are directed to the column decoders 8. Outputs of the column decoders and row decoders represent select lines whereby outputs from the row decoders enable an entire row. A column multiplexer then selects a column from the enabled row. Thus, data located at a selected location is output from the memory core via column select and data lines connected to a column multiplexer 10, with the column multiplexer 10 selecting a set of data lines for output from the memory. The multiplexed output from column multiplexer 10 is buffered by a row of I/O buffers 12 and provided as an m bit data output.

As would be expected, the delays associated with different paths through the FIG. 1 circuit block will vary depending, among other conditions, on which components a signal must pass through from the input address lines to the output data lines. As referenced herein, a "component" refers to a primitive (i.e., basic) circuit element (e.g., single logic gate), and can be used to form a stage. As referenced herein, a "stage" refers to a portion of a circuit block which includes logic and/or wiring paths having associated signal propagation ramp delays. A stage can consist of a single primitive component (e.g., single logic gate) or a stage can be any combination of components and wire paths between the components. The FIG. 1 example includes a plurality of stages.

An exemplary schematic floor plan within a given stage wherein components of the stage form potential alternate paths is illustrated in FIG. 2. As shown in FIG. 2, a signal received at a node labelled "in" can pass to an output node labelled "out" via one of two alternate paths. A first path includes components 14 and 18 while a second path includes components 16 and 18. Each of the nodes can be connected to any number of additional stages.

In FIG. 1, some signals will pass from the circuit block input to the circuit block output through components included within stages of the row decoder logic. Some signals will pass through the components included in stages of the column decoder logic. Accordingly, to account for signal propagation ramp delays which dictate memory access time, the longest potential propagation ramp delay (i.e., the critical delay) from the input address lines to the output data lines of the FIG. 1 circuit is determined.

In accordance with exemplary embodiments of the invention, the critical delay is determined without actually building a circuit block or preparing a detailed simulation model for the entire circuit. Rather, exemplary embodiments of the present invention use a block compiler system to determine a critical delay based on physical characteristics (e.g., capacitance, wire length and so forth) and using primitive models for each component. Preferably, the block compiler system uses precomputed primitive models of the components provided at run-time to more accurately and efficiently determine total propagation ramp delays.

An exemplary determination of a total propagation time representing a critical delay (i.e., critical pin-to-pin delay) will be described with respect to FIG. 3. Step 20 of FIG. 3 illustrates that the determination of a critical path through a compiled circuit block is an iterative process, whereby each alternate path "i" is separately considered.

Beginning with a first path through a circuit block, a total delay associated with each component in the path is determined, as represented by step 22 of FIG. 3. As mentioned above, each stage can include any number of components which establish alternate paths through the stage. In accordance with an exemplary embodiment, the longest (i.e., critical) delay for a given stage can be determined by calculating the total propagation ramp delay for each of the alternate paths through a stage using the process steps to be described below. Afterwards, the alternate path through the stage having the maximum delay is selected as the critical delay for that stage such that the critical path for the circuit block can be determined.

While delays associated with all of the alternate paths through the circuit block can be calculated, those skilled in the art will appreciate that in practice, all possible paths need not be considered. Rather, the alternate paths considered can be limited to a subset of paths based on predetermined assumptions about the architecture. For example, in a RAM having address inputs located in a left-hand side of the circuit block, it may be known in advance, depending on the architecture, that the critical path will encompass the rightmost column of the memory core. Thus, only alternate paths through that column need be considered.

For each component in a path under consideration, the capacitive output load of an output wire from the component is determined. As reflected by step 24 of FIG. 3, this determination is performed based upon estimated wire length and the input capacitance of additional components connected to the wire (i.e., capacitance due to fanout). The estimated wire length and the fanout are based upon a predetermined placement sequence that would be followed by the block compiler system were it to actually create a compiled circuit block.

In step 26 of FIG. 3, the total output load of a component in an alternate path under consideration is determined by using the estimated output wire length. This output wire length corresponds to a total estimated wire length between the component output and all directly serially connected components or stages. In accordance with an exemplary embodiment, any portion of the output wire included in the component itself need not be considered as part of the total output wire length. Rather, any significant wire delay internal to a component can be included in a value associated with the component's internal delay.

It is important to understand that exact placement of components is known in advance (i.e., built into the compiler) such that estimation of wire length can be exact. The placement information is based upon exact relative component placements and known wiring paths given these relative placements. The compiler derives exact wire length information by determining where it would place the components relative to one another were it to build the circuit block, and then independently considers the total propagation ramp delay associated with each component and its output load.

Thus, the compiler does not actually build the circuit block. Further, costly timing simulations using empirically estimated wiring delays, which are relatively inaccurate, need not be run. Traditionally, such empirical estimations involve using a statistical study of other designs, to determine, for example, the average wiring capacitance associated with a potential wire route.

Using the estimated output wire length for a given component, the output load due to wire capacitance ($C_{wire}$) is determined. The output load wire capacitance is determined by multiplying the estimated output wire length by a constant capacitance per unit wire length, $K_c$. The value $K_c$ for a particular wire is predetermined as a function of the fixed wire width for a circuit block. Estimating a value of $K_c$ on the basis of wire width is considered sufficiently accurate for purposes of the presently described exemplary embodiment.

In step 28 of FIG. 3, the component output load due to fanout (i.e., $C_{fanout}$) is determined. This portion of the output load represents the input capacitance of all components or stages which are serially connected to and driven by the output wire of the component currently being considered. The input capacitance $C_{in}$ for each of "n" fanout components is an internal characteristic of each fanout component which can be accessed efficiently (e.g., from memory or from disk) at run-time from a model representing the component. Because the compiler knows how it would place the components and stages of the circuit block, it has a priori knowledge of the fanout components which would be connected to any given output wire. The input capacitances $C_{in}$ for each of the n components to be connected to the output wire under consideration are therefore combined (e.g., summed) to determine the output load due to fanout.

In step 30 of FIG. 3, a total capacitive output load $C_{load}$ is computed. The total capacitive output load of a component under consideration is determined by adding the output load due to wire capacitance ($C_{wire}$) and the output load due to fanout ($C_{fanout}$).

In step 32 of FIG. 3, the total propagation ramp delay $P_d$ for a component (or a stage, if only one component is included in the stage) is determined. The total propagation ramp delay is computed by adding an internal propagation ramp delay of the component or stage to the ramp propagation delay due to output load of the component or stage.

The internal propagation ramp delay of the component or stage, represented as $P_{int}$ is determined by the block compiler system. The block compiler system reads this information for the component from, for example, the precomputed primitive model of each component provided at run-time with the block compiler system.

To determine the ramp propagation delay due to output load of a component, the primitive model of each component includes a predetermined ramp factor $K_r$ and predetermined input pin capacitances. Any effect of output capacitance within a component can be taken into account in the values for $P_{int}$ and $K_r$. The ramp factor $K_r$ represents a constant delay per unit output load for the component (where desired, values of $P_{int}$ and $K_r$ can also be provided for a stage). Accordingly, a propagation ramp delay for a component under consideration, $P_{ramp}$, is determined in step 32 by multiplying the total capacitive output load $C_{load}$ (as determined in step 30) by the ramp factor for that component, $K_r$. The total delay for the component or stage under consideration, $P_d$, is subsequently determined by combining (e.g., adding) the internal propagation delay $P_{int}$ and the propagation ramp delay $P_{ramp}$ as shown in step 32 of FIG. 3.

After determining the total propagation ramp delay for a component or stage under consideration, this propagation ramp delay is combined with all previously determined propagation ramp delays for the path under consideration in step 33. Afterwards, operation of the FIG. 3 flow chart returns to step 22 to consider the next primitive component or stage in the ith path under consideration until a number "j" of such components and/or stages in the path currently under consideration have been considered. When the propagation ramp delay for the $j^{th}$ component or stage in a given path "i" has been computed, a total propagation ramp delay $P_{TOTAL_i}$ for the path is determined in step 33 by summing the j propagation ramp delays $P_d$ associated with the j components and/or stages of a given path. Afterwards, the delay $P_{TOTAL_i}$ which is a function of the individual components located in the path can be stored in memory as $P_{TOTAL}$ via steps 34 and 35.

After storing the total propagation ramp delay for a given path, operation of the FIG. 3 flow chart returns to step 22 where a next alternate path is considered for the circuit block in the manner described above. As represented by steps 34 and 35, if the value of $P_{TOTAL_i}$ for a second alternate path (e.g., $P_{TOTAL_2}$) exceeds the current stored $P_{TOTAL}$, (e.g., $P_{TOTAL_1}$), the currently stored information associated with $P_{TOTAL}$ is replaced with $P_{TOTAL_i}$ of the second path. In other words, the $P_{TOTAL}$ output of step 34 represents the maximum delay for all the paths considered so far.

When the propagation ramp delay for the last alternate path in the circuit block has been computed, the FIG. 3 flow chart exits step 20 and the operation is done (step 37) for the circuit block under consideration. At that time, the stored information associated with $P_{TOTAL}$ in memory corresponds to the path having the critical delay through the circuit block. Thus, the above-described process includes determining total pin-to-pin timing delays by combining the pin-to-pin timing delays and wiring delays, including output ramp delays due to wiring and fan-out, of components on a critical signal path through a compiled block under consideration.

After determining the critical pin-to-pin speed for a given circuit block configuration, it can be determined whether the circuit block configuration complies with predetermined constraints (e.g., timing constraints). If not, alternate block configurations can be considered. In any event, once a circuit block configuration has been determined to comply with predetermined constraints, an actual circuit block can be produced with high assurance that all timing constraints will be satisfied.

In practicing the present invention in the context of compiling a memory structure, the delay of a critical path is determined during compilation of a top-level pin-to-pin timing model for the entire memory structure. More particularly, during the determination of timing for each stage of the memory structure, a block compiler system according to the present invention compares the timing delays of parallel paths through each stage. Alternately, a computation can be performed hierarchically. For example, since a stage can include one or more components, the computation can be performed by identifying a critical path through each stage. Afterwards, a determination of the stages determined to lie along a critical path through the circuit block can be determined, whereby individual components which compose the critical path can be determined.

An exemplary computation can begin, for example, by considering the row address buffers and decoding logic. For the first stage of the address logic, the longest timing delay through the stage is selected and stored. Then, similarly, the longest timing delay for the next serial stage in the input/output path is calculated, and the longest one taken. For example, the longest delay may go through the row decoding logic or the column decoding logic. The timing delay for that second stage is then added to the largest delay of the first stage. Where plural second stages are connected to the first stage in parallel, a delay for each parallel path is calculated. These steps are repeated for the entire memory structure. Afterwards, the summation of all of the longest timing delays for the various stages is determined and that number serves as an estimate of the critical path access time for the entire memory structure.

In using the above-described procedures to select an optimum memory structure organization for producing a circuit block, a block compiler system can iteratively compute the overall physical size, and determine the access times (i.e., the critical delays) of the memory for each candidate organization. If desired, physical memory size (in addition to timing determination) can be computed exactly based upon information built into the block compiler system concerning the memory structure architecture. Those skilled in the art will recognize that while the present invention has been described with respect to memory structures, the invention can be similarly applied to compiling structures other than memory structures. For example, any circuit can be produced by combining delays of lower level components and delays due to interconnect capacitance based upon a predetermined relative component placement sequence and physical characteristics of a yet unbuilt circuit block configuration.

In an alternate exemplary embodiment of the present invention, the block compiler system determines the name of the component at each location within a compiled circuit block—whether a memory structure or otherwise—by employing a set of component and connector naming conventions. The connector names encode various wiring directives that the block compiler system uses to make connections properly.

Because the block compiler system can extract physical characteristics of each component (e.g., size and delay information) from the components themselves—by accessing the component layouts and models—calculated values of physical access delay and physical memory size automatically track with changes in the components. Accordingly, if component layouts and their models are ported to a new process technology, their contents are transparent to the block compiler system. In other words, even if primitive models of components change for a different technology, the above-described procedures remain the same for determining the pin-to-pin timing of a circuit block.

It can be readily appreciated by those skilled in the art that the above-described method of determining delays is rapid, highly accurate and flexible. These advantages result from the above-described methods, including the steps of estimating wire lengths individually based upon a predetermined relative component placement sequence and tracking changes in components as primitive models change.

Those skilled in the art will recognize that a significant feature of the present invention is the determination and comparison of delays through alternate paths of a circuit block without requiring that the circuit block be built. In accordance with the present invention, those skilled in the art will recognize that alternate techniques can be used to determine a critical path through a circuit block which includes plural stages. For example, for a given input and output pin, every path through the circuit block can be individually assessed at the component level. Alternately, a hierarchical approach can be used whereby the critical path through each stage can be identified, after which the critical delays for the stages included in each path can be summed. In some cases, this hierarchical approach can decrease the amount of computation or storage necessary when, for example, alternate paths diverge and recombine within a stage.

The foregoing has described the principles, preferred embodiments and modes of operation of the present invention. However, the present invention should not be construed as being limited to the particular embodiments discussed. Accordingly, the above-described embodiments should be regarded only as illustrative, and it should be appreciated that workers skilled in the art may make variations in those embodiments without departing from the spirit and scope of the invention as defined by the following claims.

What is claimed is:

1. A process for producing an electrical circuit comprising the steps of:

determining a signal delay of a component due to physical characteristics of the component, said physical characteristics including at least a capacitance based upon a predetermined relative placement of the component during compilation of a circuit block;

determining an input-to-output speed for a circuit block by determining delays due to physical characteristics through alternate paths of the circuit block; and producing a compiled circuit block having said predetermined relative placement.

2. A process according to claim 1, wherein said step of determining a signal delay further includes steps of:

accessing a stored propagation delay as a physical characteristic of at least one component to be placed in said circuit block; and determining an output load for said at least one component.

3. A process according to claim 2, wherein said step of determining an output load of said at least one component further includes a step of:

combining the input capacitance of additional components that are connected to an output wire of the at least one component and estimating the output wire length.

4. A process according to claim 3, wherein said step of determining an output load of a component further includes a step of:

determining an output load due to wire capacitance based on the estimated output wire length and a value of capacitance per unit length.

5. A process according to claim 3, wherein said step of combining the input capacitance of additional components connected to the output wire and estimating output wire length further includes a step of:

accessing a stored placement sequence when compiling the circuit block.

6. A process according to claim 5, wherein the step of determining the input-to-output speed further includes a step of:

summing pin-to-pin timing delays of components on a signal path through the circuit block.

7. A process according to claim 3, further including a step of:

determining an output load propagation ramp delay of said at least one component as a function of a ramp factor.

8. A process according to claim 3, further including a step of:

determining a critical path having longest pin-to-pin timing delay through a circuit block from a circuit block input to a circuit block output.

9. A process according to claim 1, wherein said step of determining an input-to-output speed for a circuit block is performed hierarchically.

10. A process for controlling a block compiler system to produce a compiled circuit block comprising the steps of:

determining a signal delay due to physical characteristics of a component, said physical characteristics including at least a capacitance based upon a predetermined relative placement of the component during compilation of a circuit block: and determining input-to-output said for a circuit block by combining delays due to physical characteristics through alternate paths of a compiled circuit block having said predetermined relative placement.

11. A process according to claim 10, wherein said step of determining a signal delay further includes steps of:

accessing a stored propagation delay as a physical characteristic of at least one component to be placed in said circuit block; and determining an output load for said at least one component.

12. A process according to claim 11, wherein said step of determining an output load of said at least one component further includes a step of:

combining the input capacitance of additional components that are connected to an output wire of the at least one component and estimating the output wire length.

13. A process according to claim 12, wherein said step of determining an output load of a component further includes a step of:

determining an output load due to wire capacitance based on the estimated output wire length and a value of capacitance per unit length.

14. A process according to claim 12, wherein said step of combining the input capacitance of additional components connected to the output wire and estimating output wire length further includes a step of:

accessing a stored placement sequence when compiling the circuit block.

15. A process according to claim 14, wherein the step of determining the input-to-output speed further includes a step of:

summing pin-to-pin timing delays of components on a signal path through the circuit block.

16. A process according to claim 12, further including a step of:

determining an output load propagation ramp delay of said at least one component as a function of a ramp factor.

17. A process according to claim 12, further including a step of:

determining a critical path having longest pin-to-pin timing delay through a circuit block from a circuit block input to a circuit block output.

18. A process according to claim 10, wherein said step of determining an input-to-output speed for a circuit block is performed hierarchically.

19. A process according to claim 18, wherein said steps of hierarchically determining input-to-output speed further include steps of:

determining components within each stage which form a critical path through the stage; and determining stages of the circuit block, based on critical paths of each stage, which form the alternate path having a longest delay through the circuit block.

20. A process according to claim 10, further including a step of:

tracking changes in components of the circuit block as primitive models of components changes.

* * * * *